United States Patent
Chen

(10) Patent No.: US 8,050,044 B2
(45) Date of Patent: Nov. 1, 2011

(54) POWER PLANE AND A MANUFACTURING METHOD THEREOF

(75) Inventor: Yen-Hao Chen, Taipei (TW)

(73) Assignee: Inventec Corporation, Taipei (TW)

( * ) Notice: Subject to any disclaimer, the term of this patent is extended or adjusted under 35 U.S.C. 154(b) by 1064 days.

(21) Appl. No.: 11/896,422

(22) Filed: Aug. 31, 2007

(65) Prior Publication Data

US 2009/0058560 A1 Mar. 5, 2009

(51) Int. Cl.
*H05K 7/02* (2006.01)
*H05K 7/06* (2006.01)
*H05K 7/08* (2006.01)
*H05K 7/10* (2006.01)

(52) U.S. Cl. .......... 361/760; 361/792; 361/794

(58) Field of Classification Search .......... 361/792–795
See application file for complete search history.

(56) References Cited

U.S. PATENT DOCUMENTS

| | | | | |
|---|---|---|---|---|
| 5,272,600 | A * | 12/1993 | Carey | 361/792 |
| 6,418,031 | B1 * | 7/2002 | Archambeault | 361/762 |
| 6,430,735 | B2 * | 8/2002 | Uchida | 716/127 |
| 6,523,154 | B2 * | 2/2003 | Cohn et al. | 716/112 |
| 7,240,314 | B1 * | 7/2007 | Leung | 257/773 |

* cited by examiner

*Primary Examiner* — Tuan T Dinh
(74) *Attorney, Agent, or Firm* — CKC & Partners Co., Ltd.

(57) ABSTRACT

A power plane includes a first circuit region and a second circuit region. The length of the first circuit region or second circuit region is related to the noise frequency to be filtered out. The width of the first circuit region can be wider or narrower than the width of the second circuit region. While manufacturing the power plane, a predetermined length is decided according to the resonance frequency of an original power plane, then the proposed power plane is formed with the first circuit region and the second circuit region of a predetermined length, and making the width of the first circuit region wider or narrower than the width of the second circuit region, such that the noises with the resonance frequency can be mitigated.

12 Claims, 3 Drawing Sheets

POWER PLANE AND A MANUFACTURING METHOD THEREOF

BACKGROUND

1. Field of Invention

The present invention relates to a power plane and a manufacturing method thereof. More particularly, the present invention relates to a power plane and the manufacturing method which is able to filter out resonant high frequency noises.

2. Description of Related Art

In high-speed digital circuits, plane noises are generated when high-speed signals pass through an non-ideal path, such as the via or a discontinuous reference plane. The plane noises might propagate to other positions between planes of digital circuit board in a parallel-plate waveguide form.

To prevent plane noises interfering with the electronic components on the digital circuit, the power plane of the digital circuit is initially divided into at least two parts in the beginning, then the decoupling capacitance or the inductor may be added between the divided power planes for filtering out the noises traditionally.

Although dividing the power plane into several parts can filter out the low frequency noises, the resonant high frequency noises can not be filtered out, yet. The remaining high frequency noises might make the signals which are passed on the power plane imperfect, or interfere with the electronic components on the digital circuit.

For the foregoing reasons, there is a need for a new power plane and a manufacturing method thereof, which effectively filters out the resonant high frequency noises.

SUMMARY

According to one embodiment of the present invention, a power plane that supplies a dc potential and filters out the noises includes a first circuit region and a second circuit region. The length of the first circuit region is related to the noise frequency that the power plane designed to filter out. The second circuit region is connected to the first circuit region. The length of the second circuit region is also related to the noise frequency that the power plane designed to filter out. The width of the second circuit region is unequal to the width of the first circuit region.

According to another embodiment of the present invention, a method for manufacturing a power plane, used for providing a dc potential and filtering out the noises, is disclosed. The method includes estimating a pre-determined length according to the resonance frequency of an original power plane, forming a first circuit region and a second circuit region with the pre-determined length, and making the width of the first circuit region greater than or less than the width of the second circuit region, in order to filter out the noise with the resonance frequency.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
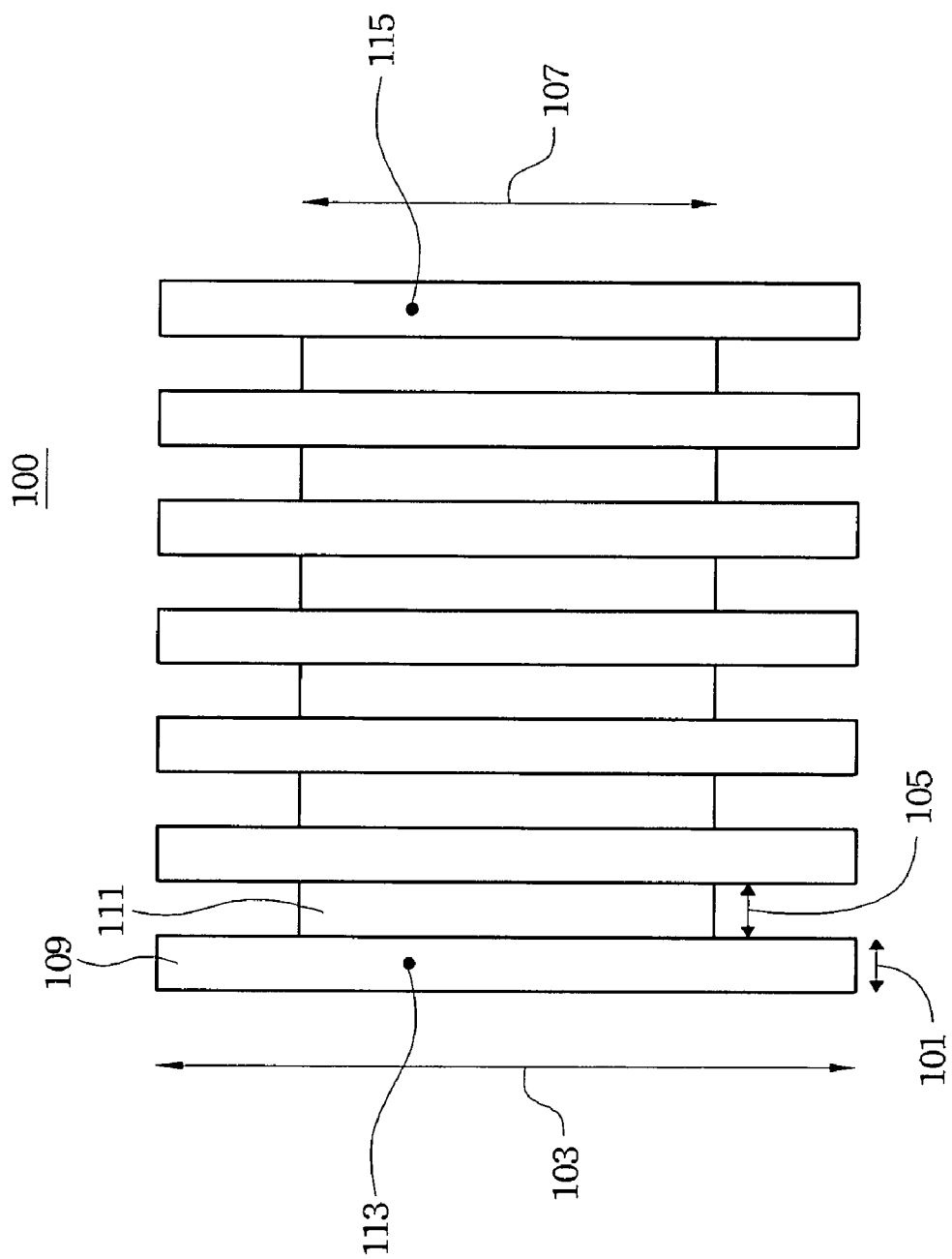
FIG. 1 shows a power plane according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The power plane of the embodiment shown below passes a dc potential and filters out resonant high frequency noises effectively.

FIG. 1 shows a power plane according to one embodiment of the present invention. Power plane 100 includes a first circuit region 109, and a second circuit region 111 connected to the first circuit region 109. The circuit regions can be made out of the printed circuit board. The noises on the power plane can be filtered out while the noises pass from the input end 113 (noisy end) to the receiver end 115 (interference end).

The length 101 of the first circuit region 109 and the length 105 of the second circuit region 111 are related to the noise frequency that the power plane designed to filter out. The relationship between the circuit region lengths, the material of the circuit regions, and the noise frequency is $L = V_p / 4f\sqrt{\in_{eff}}$, where L represents the length 101 of the first circuit region 109, $V_p$ represents the phase velocity which is $3\times10^8$ m/s, f represents the noise frequency, and $\in_{eff}$ represents the effective dielectric constant of the circuit region. For example, if the first circuit region 109 and the second circuit region 111 are a printed circuit board, then the $\in_{eff}$ is the effective dielectric constant of the printed circuit board.

The length 105 of the second circuit region 111 can be equal to the length 101 of the first circuit region 109, or can also be adjusted as required. The width 107 of the second circuit region 111 may be greater than or less than the width 103 of the first circuit region 109. The width difference between the width 103 (the width of the first circuit region 109) and the widths 107 (the width of the second circuit region 111) is related to a bandstop bandwidth. For example, increasing the width difference between the width 103 and the width 107 can increase the bandstop bandwidth.

The first circuit region 109 and the second circuit region 111 transmit high frequency signals. As a result of high frequency response, the impedance of the first circuit region 109 is different from the impedance of the second circuit region 111. In other words, the first circuit region 109 acts as a capacitor and the second circuit region 111 acts as an inductor when high frequency signals pass through them. According to the theory of microwave filter, if the capacitors and inductors are cascaded with such stepped type, the entirety can operates as a low pass filter, which filters out the high frequency noises. In addition, adjusting the number of the first circuit region 109 and the second circuit region 111 as required promotes the effect of the noise filtering.

Figure 2:
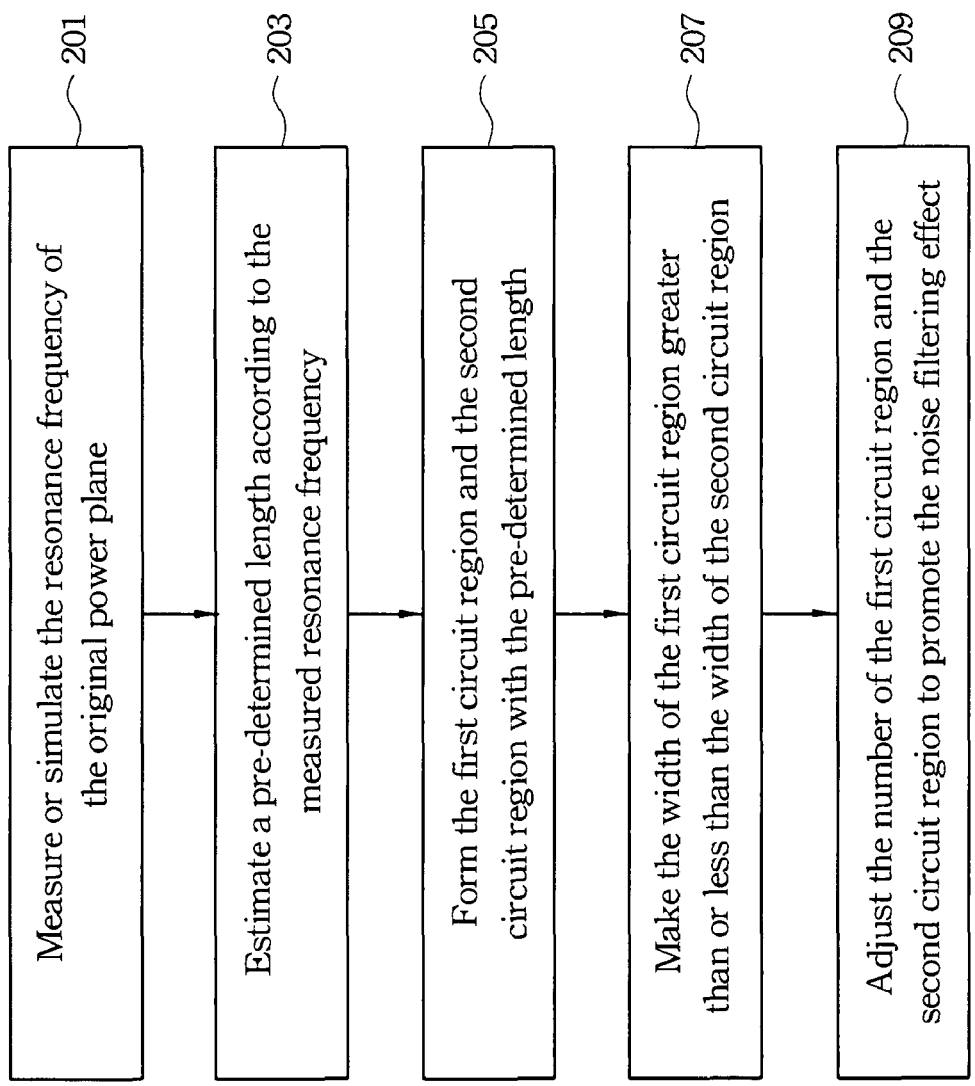
FIG. 2 shows a manufacturing method of the power plane according to one embodiment of the present invention.

FIG. 2 show the method for manufacturing the power plane according to one embodiment of the present invention. In the beginning, measure or simulate the resonance frequency of the original power plane (step 201). If the material and the size of the original power plane vary, the resonance frequency varies as well. Next, estimate a pre-determined length according to the measured resonance frequency (step 203). The pre-determined length is estimated with the equation $L=V_p/4f\sqrt{\in_{eff}}$, where L represents the pre-determined length, $V_p$ represents the phase velocity which is $3\times10^8$ m/s, f represents the noise frequency, and $\in_{eff}$ represents the effective dielectric constant. The first circuit region and the second circuit region with the pre-determined length are able to filter out the noises of the resonance frequency. For example, if the resonance frequency to be filtered out is 5 GHz, and the dielectric constant is 4.4, then the 5 GHz noise can be filtered out by the first circuit region and the second circuit region with a length of 7.15 mm.

Then, form the first circuit region and the second circuit region with the pre-determined length (step 205). After that, make the width of the first circuit region greater than or less than the width of the second circuit region to filter out the noise with the resonance frequency (step 207). The circuit regions can be manufactured by cutting a circuit board into the first circuit region and the second circuit region, or by connecting circuit boards of two sizes (step 205 and step 207). After that, adjust the number of the first circuit regions and the second circuit regions to promote the noise filtering effect (step 209) as required. For example, the total length can also be extended to the length of original power plane by connecting the first circuit regions and second circuit regions repeatedly.

Figure 3:
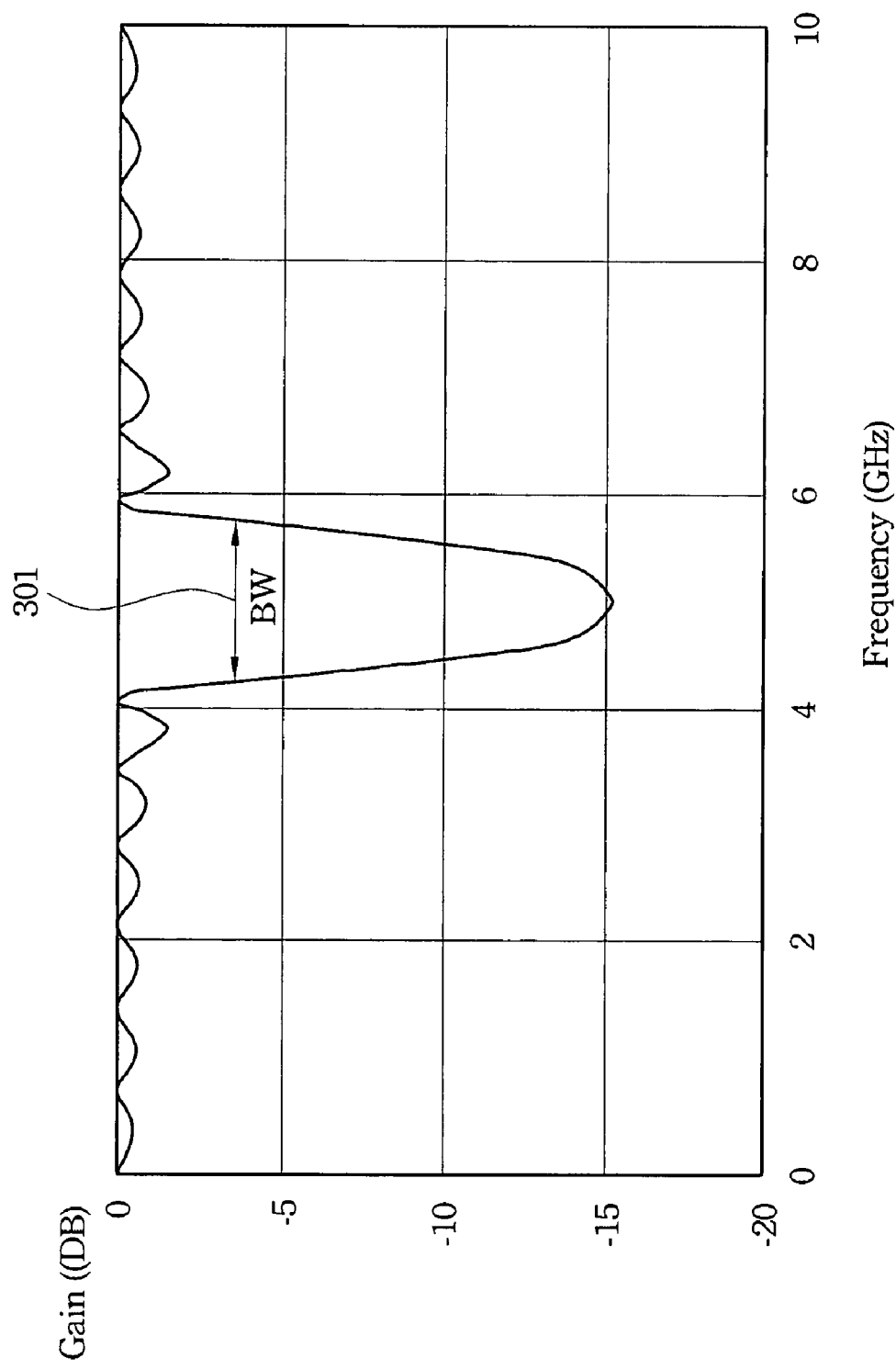
FIG. 3 shows the frequency response of the noise on the power plane according to one embodiment of the present invention.

FIG. 3 shows the simulated frequency response of the power plane according to one embodiment of the present invention. According to the simulated frequency response, the noise with 5 GHz frequency can be rejected by the power plane which is made by connecting the first circuit regions and the second circuit regions of the specified sizes. The bandstop bandwidth 301 (the noises frequency within this bandstop bandwidth are rejected) is in proportion to the difference between the first circuit region width and the second circuit region width. In other words, adjusting the width difference between the width of the first circuit region and the width of the second circuit region can change the bandstop bandwidth 301.

According to the above embodiment, the power plane made of circuit regions with specified sizes can filter out high frequency noises. In addition, the bandstop bandwidth can be adjusted by adjusting the difference between the first circuit region width and the second circuit region width.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power plane, used for providing a dc potential and filtering out the noises on the power plane, comprising:
a first circuit region, wherein the length of the first circuit region is related to the noise frequency that the power plane is designed to filter out; and
a second circuit region coupled to the first circuit region, wherein the length of the second circuit region is related to the noise frequency to be filtered out, and the width of the second circuit region is unequal to the width of the first circuit region,
wherein the length of the first circuit region is equal to the length of the second circuit region,
wherein the lengths of the first circuit region and the second region are
$L=Vp/4f\sqrt{(\in_{eff})}$, where L represents the length of the first circuit region and the second circuit region, Vp represents the phase velocity, f represents the noise frequency, and $\in_{eff}$ represents the effective dielectric constant of the first circuit region and the second circuit region.

2. The power plane of claim 1, wherein the widths of the first circuit region and the second circuit region are related to a bandstop bandwidth of the noises on the power plane.

3. The power plane of claim 1, wherein the impedance magnitude of the first circuit region is smaller than the impedance magnitude of the second circuit region.

4. The power plane of claim 1, wherein the impedance magnitude of the first circuit region is greater than the impedance magnitude of the second circuit region.

5. The power plane of claim 1, wherein the effect of the noise filtering is in proportion to the number of the first circuit regions and the second circuit regions.

6. The power plane of claim 1, wherein the first circuit region and the second circuit region are two printed circuit boards.

7. The power plane of claim 1, wherein the dc potential is a power potential or a ground potential.

8. The power plane of claim 2, wherein the bandstop bandwidth is related to a width difference between the width of the first circuit region and the width of the second circuit region.

9. A method for manufacturing a power plane used to provide a dc potential and filter out the noises on the power plane, comprising:
estimating a pre-determined length according to a resonance frequency of an original power plane;
forming a first circuit region and a second circuit region with the pre-determined length; and
making the width of the first circuit region greater than or less than the width of the second circuit region for filtering out the noises with the resonance frequency,
wherein the length of the first circuit region is equal to the length of the second circuit region,
wherein the pre-determined length of the first circuit region and the second circuit region is $L=Vp/4f\sqrt{(\in_{eff})}$, where L represents the pre-determined length of the first circuit region and the second circuit region, Vp represents the phase velocity, f represents the noise freqency and $\in_{eff}$ represents the effective dielectric constant of the first circuit region and the second circuit region.

10. The method of claim 9, further comprising adjusting the widths of the first circuit region and the second circuit region for tuning the bandstop bandwidth to filter out noises.

11. The method of claim 9, wherein the number of the first circuit regions and the second circuit regions can be adjusted to promote the effect of the noise filtering.

12. The method of claim 10, wherein the bandstop bandwidth is related to a width difference between the width of the first circuit region and the width of the second circuit region.

* * * * *